(12) United States Patent
Ruby et al.

(10) Patent No.: US 9,444,428 B2
(45) Date of Patent: Sep. 13, 2016

(54) FILM BULK ACOUSTIC RESONATORS COMPRISING BACKSIDE VIAS

(71) Applicant: Avago Technologies General IP (Singapore) Pte. Ltd., Singapore (SG)

(72) Inventors: Richard C. Ruby, Menlo Park, CA (US); Steve Martin, Fort Collins, CO (US); Brice Ivira, San Jose, CA (US); Suresh Sridaran, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 13 days.

(21) Appl. No.: 14/471,210

(22) Filed: Aug. 28, 2014

(65) Prior Publication Data

US 2016/0065171 A1    Mar. 3, 2016

(51) Int. Cl.
| | | |
|---|---|---|
| *H03H 9/54* | (2006.01) | |
| *H03H 9/02* | (2006.01) | |
| *H03H 9/08* | (2006.01) | |
| *H03H 9/17* | (2006.01) | |
| *H01L 41/047* | (2006.01) | |
| *H01L 41/04* | (2006.01) | |
| *H03H 3/02* | (2006.01) | |
| *H03H 9/13* | (2006.01) | |

(52) U.S. Cl.
CPC ............ *H03H 9/54* (2013.01); *H03H 9/02086* (2013.01); *H03H 9/02102* (2013.01); *H03H 9/08* (2013.01); *H01L 41/04* (2013.01); *H01L 41/0477* (2013.01); *H03H 3/02* (2013.01); *H03H 9/132* (2013.01); *H03H 9/171* (2013.01)

(58) Field of Classification Search
CPC ..................... H03H 9/02086; H03H 9/02125; H03H 9/02102; H03H 9/02448; H03H 9/02842; H03H 9/08; H03H 9/54; H03H 9/171; H03H 3/02; H03H 9/132; H01L 41/0477; H01L 41/04
USPC .......................... 333/133, 186–189; 310/346
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 5,910,756 A | 6/1999 | Ella |
| 6,107,721 A | 8/2000 | Lakin |
| 6,228,675 B1 | 5/2001 | Ruby et al. |
| 6,262,637 B1 | 7/2001 | Bradley et al. |
| 6,376,280 B1 | 4/2002 | Ruby et al. |
| 6,377,137 B1 * | 4/2002 | Ruby ............. H03H 3/02 29/25.35 |
| 6,429,511 B2 | 8/2002 | Ruby et al. |
| 6,507,983 B1 | 1/2003 | Ruby et al. |
| 6,777,267 B2 | 8/2004 | Ruby et al. |
| 6,828,713 B2 | 12/2004 | Bradley et al. |
| 7,280,007 B2 | 10/2007 | Feng et al. |
| 7,345,410 B2 | 3/2008 | Grannen et al. |
| 7,388,454 B2 | 6/2008 | Ruby et al. |

(Continued)

OTHER PUBLICATIONS

Co-pending U.S. Appl. No. 14/161,564, filed Jan. 22, 2014.

(Continued)

*Primary Examiner* — Benny Lee
*Assistant Examiner* — Jorge Salazar, Jr.

(57) ABSTRACT

An film bulk acoustic wave resonator (FBAR) structure has an FBAR and a via disposed substantially directly beneath the FBAR. The via is in thermal contact with the FBAR. A plurality of vias may be included. The via(s) serve to dissipate heat generated by the FBAR structure during operation.

59 Claims, 12 Drawing Sheets

(56) References Cited

U.S. PATENT DOCUMENTS

| | | |
|---|---|---|
| 7,422,929 B2 | 9/2008 | Gallup et al. |
| 7,629,865 B2 | 12/2009 | Ruby |
| 7,714,684 B2 | 5/2010 | Ruby et al. |
| 7,791,434 B2 | 9/2010 | Fazzio et al. |
| 8,102,044 B2 | 1/2012 | Ruby et al. |
| 8,188,810 B2 | 5/2012 | Fazzio et al. |
| 8,232,845 B2 | 7/2012 | Ruby et al. |
| 8,248,185 B2 | 8/2012 | Choy et al. |
| 8,593,037 B1 | 11/2013 | Kubena et al. |
| 8,648,671 B2 | 2/2014 | Son et al. |
| 8,680,944 B2 | 3/2014 | Ye et al. |
| 2007/0205850 A1 | 9/2007 | Jamneala et al. |
| 2010/0327994 A1 | 12/2010 | Choy et al. |
| 2011/0180391 A1 | 7/2011 | Larson, III et al. |
| 2011/0268152 A1* | 11/2011 | Becker .................. G01K 7/023 374/179 |
| 2012/0025269 A1 | 2/2012 | Parkhurst et al. |
| 2012/0025370 A1 | 2/2012 | Wholey et al. |
| 2012/0074555 A1 | 3/2012 | Snyder et al. |
| 2012/0104900 A1* | 5/2012 | Nishihara ............. H03H 9/584 310/326 |
| 2012/0177816 A1 | 7/2012 | Larson, III et al. |
| 2012/0326807 A1 | 12/2012 | Choy et al. |
| 2013/0134560 A1 | 5/2013 | Wholey et al. |

OTHER PUBLICATIONS

Co-pending U.S. Appl. No. 13/662,460, filed Oct. 27, 2012.
Co-pending U.S. Appl. No. 13/906,873, filed May 31, 2013.
Co-pending U.S. Appl. No. 14/191,771, filed Feb. 27, 2014.
Small, et al. "Wafer Scale Packaging for FBAR Based Oscillators.", May 2, 2011.

* cited by examiner

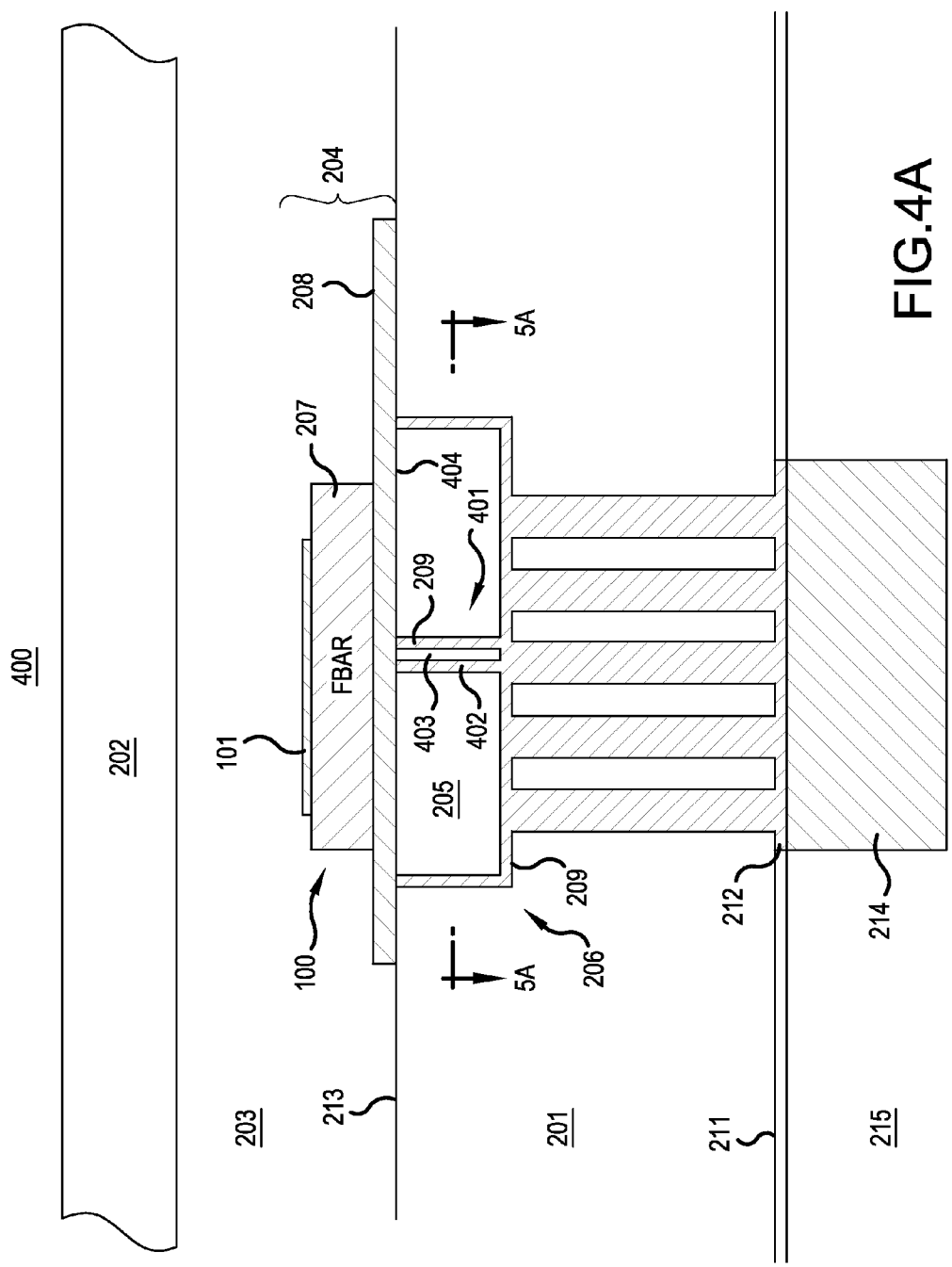

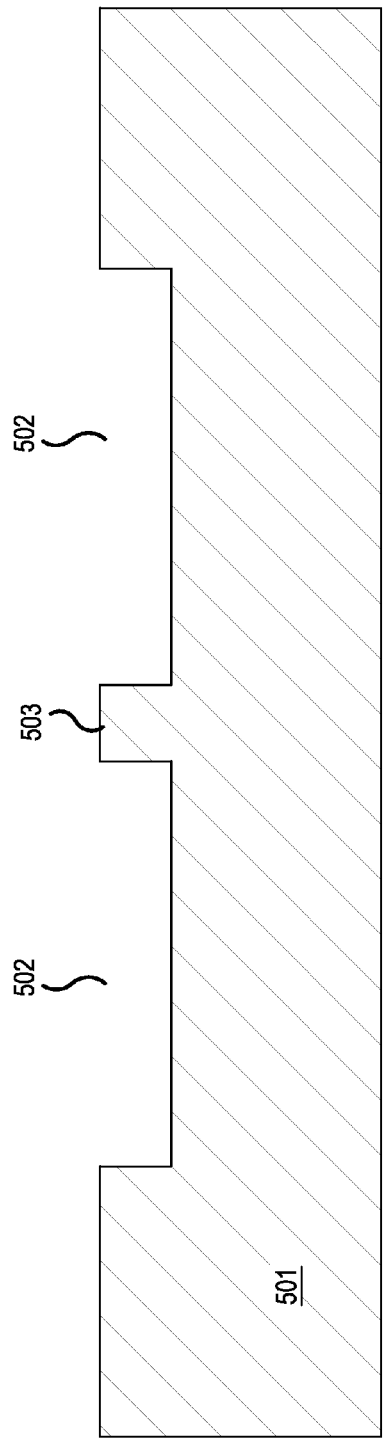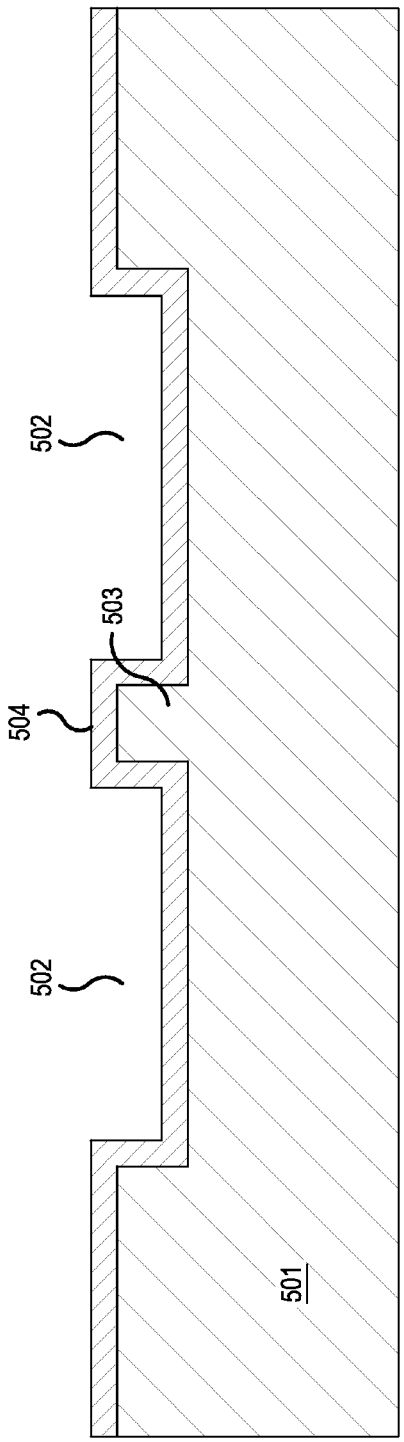

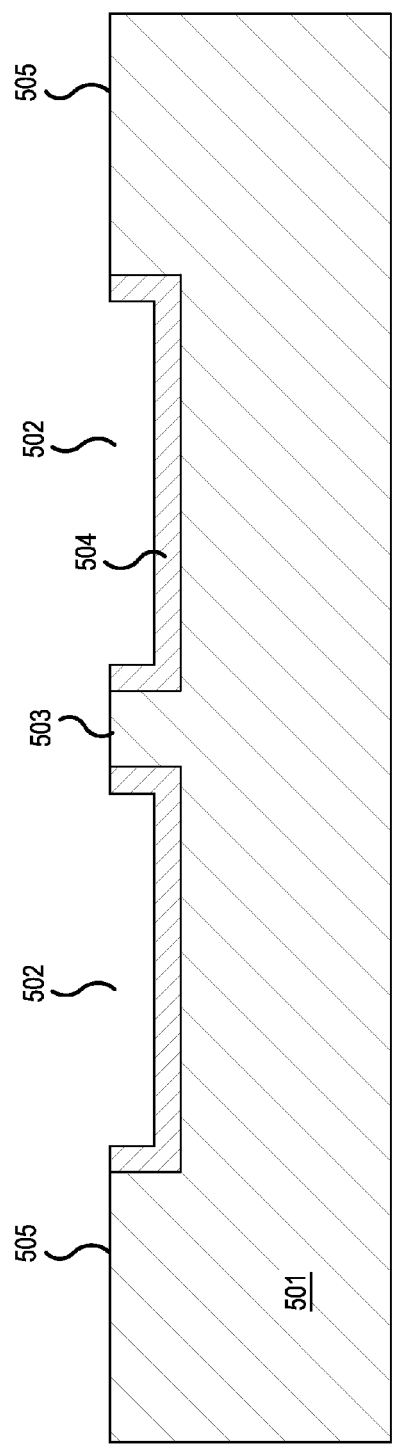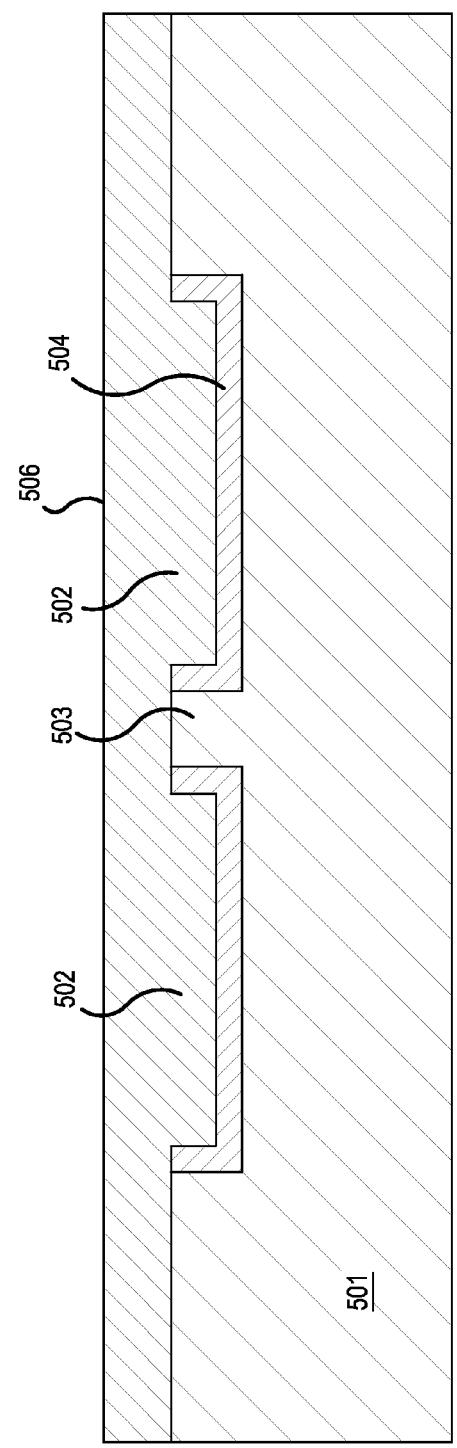

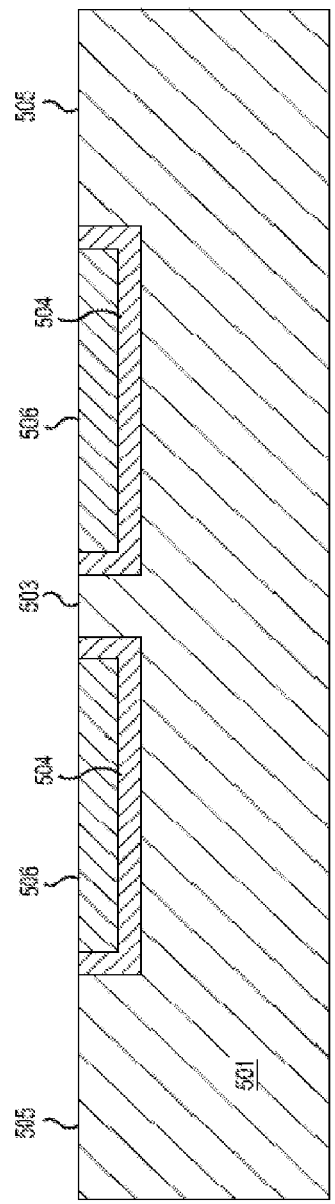
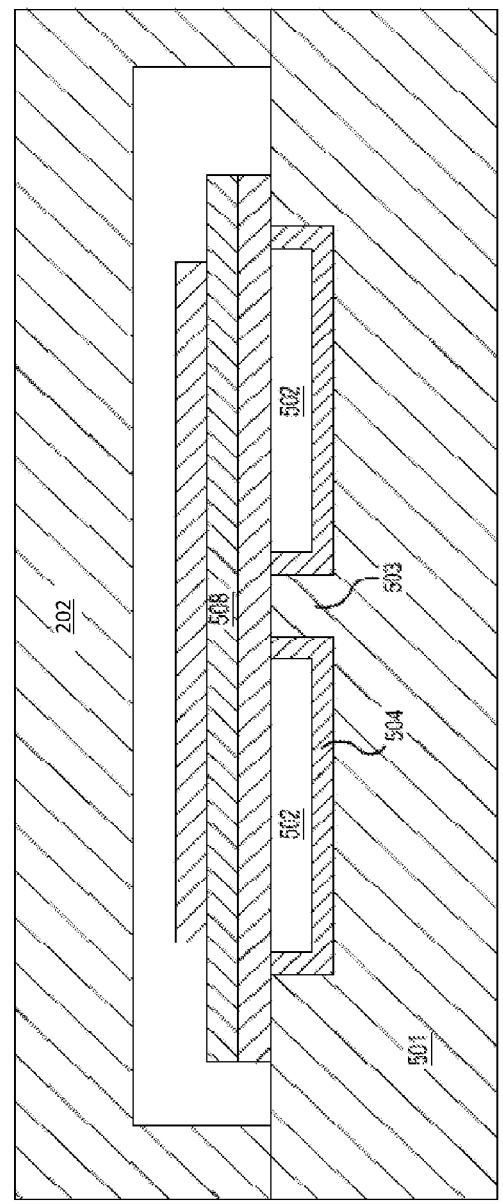
FIG.5E
FIG.5F

FILM BULK ACOUSTIC RESONATORS COMPRISING BACKSIDE VIAS

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. BAW resonators include an acoustic or resonator stack disposed over an acoustic reflector. For example, BAW resonators include thin film bulk acoustic resonators (FBARs), which include resonator stacks formed over a substrate cavity, which functions as the acoustic reflector, and solidly mounted resonators (SMRs), which include resonator stacks formed over alternating stacked layers of low acoustic impedance and high acoustic impedance materials (e.g., an Bragg mirror). The BAW resonators may be used for electrical filters and voltage transformers, for example.

As the need for reductions in the size of components increases, there is a need to reduce the footprint of individual devices, such as FBARs and components (e.g., filters) comprising a plurality of FBARs. Moreover, as power demands increase, there is a need to improve the heat dissipation of individual FBARs, and components comprising a plurality of FBARs.

What is needed, therefore, is a BAW resonator that overcomes at least the shortcomings of known BAW resonators described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4A is a cross-sectional view of an FBAR structure in accordance with a representative embodiment.

FIG. 5A-5I are cross-sectional views of a fabrication sequence for forming an FBAR structure in accordance with a representative embodiment.

DETAILED DESCRIPTION

Figure 1:
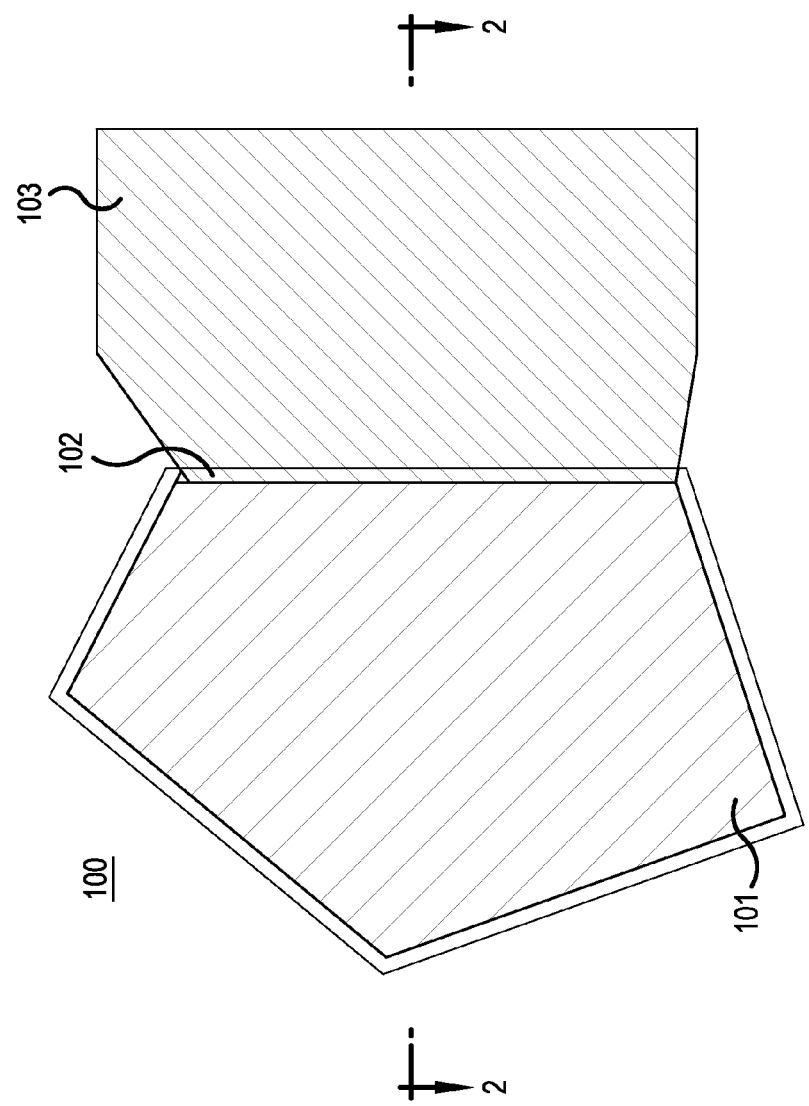
FIG. 1 a top view of an FBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Aspects of the present teachings are relevant to components of FBAR devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629, 865, 7,714,684 to Ruby et al.; U.S. Pat. Nos. 7,791,434 and 8,188,810, to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Patent Application Publication No. 20120326807 to Choy, et al. now U.S. Pat. No. 8,902,023 B2; U.S. Patent Application Publication No. 20100327994 to Choy, et al.; U.S. Patent Application Publications Nos. 20110180391 now U.S. Pat. No. 9,243,316 B2 and 20120177816 now U.S. Pat. No. 8,673,121 B2 to Larson III, et al.; U.S. Patent Application Publication No. 20070205850 to Jamneala et al. now U.S. Pat. No. 8,981,876 B2; U.S. patent application Ser. No. 14/161,564 entitled: "Method of Fabricating Rare-Earth Element Doped Piezoelectric Material with Various Amounts of Dopants and a Selected C-Axis Orientation," filed on Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; U.S. patent application Ser. No. 13/906,873 entitled "Bulk Acoustic Wave Resonator having Piezoelectric Layer with Varying Amounts of Dopants" to John Choy, et al. and filed on May 31, 2013; and U.S. patent application Ser. No. 14/191,771, entitled "Bulk Acoustic Wave Resonator having Doped Piezoelectric Layer" to Feng, et al. and filed on Feb. 27, 2014. The entire disclosure of each of the patents, published patent applications and patent application listed above are hereby specifically incorporated by reference herein. It is emphasized that the components, materials and method of fabrication described in these patents and patent applications are representative and other methods of fabrication and materials within the purview of one of ordinary skill in the art are also contemplated.

The described embodiments relate generally to FBARs, FBAR structures and electrical filters comprising FBARs. In a representative embodiment, an FBAR structure comprises: an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector. The FBAR structure further comprises a via disposed substantially directly beneath the FBAR, and being in thermal contact with the second electrode.

In another representative embodiment, an FBAR structure comprises: an FBAR comprising: a first electrode; a piezoelectric layer disposed beneath the first electrode; a second electrode disposed beneath the piezoelectric layer, and an acoustic reflector disposed beneath the second electrode, wherein the second electrode spans first and second sides of the acoustic reflector. The FBAR structure further comprises a plurality of vias, each of the plurality of vias being disposed substantially directly beneath FBAR, and being in thermal contact with the second electrode.

FIG. 1 shows a top view of FBAR 100 in accordance with a representative embodiment. A lid (not shown in FIG. 1), sometimes referred to as a microcap, may be disposed over the FBAR 100 and is useful in providing a hermetic package. The FBAR 100 comprises a first electrode 101 illustratively having five (5) sides, with a connection side 102 configured to provide an electrical connection to interconnect 103. The interconnect 103 provides electrical signals to the first electrode 101 to excite desired acoustic waves in a piezoelectric layer (not shown in FIG. 1) of the FBAR 100. Notably, an airbridge (not shown), such as described in U.S. Pat. No. 8,248,185 may be provided at the connection side 102, and cantilevered portions (not shown), such as described in U.S. Patent Application Publication 20100327994 may be provided on one or more of the sides, other than the connection side 102.

When connected in a selected topology, and as described in connection with a representative embodiment below, a plurality of FBARs 100 can function as an electrical filter. For example, the FBARs 100 may be arranged in a ladder-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as communications.

Figure 2:
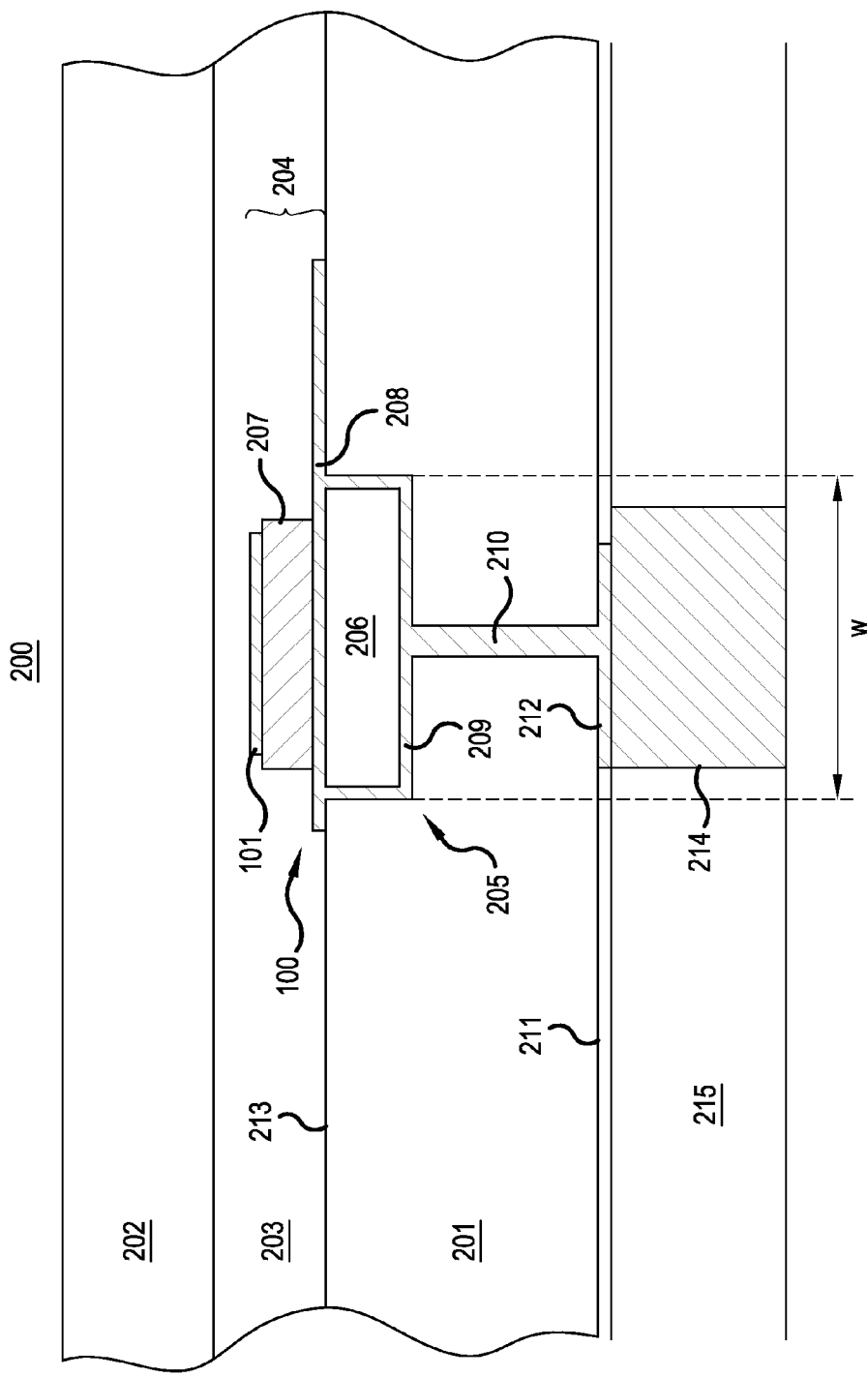
FIG. 2 is a cross-sectional view of an FBAR structure in accordance with alternative representative embodiments.

FIG. 2 shows a cross-sectional view of the FBAR structure 200 that comprises FBAR 100 taken along line 2-2 in accordance with a representative embodiment. The FBAR structure 200 comprises the FBAR 100 disposed over a substrate 201 and comprising a lid or microcap 202 disposed thereover. The microcap 202 generally comprises a material selected to substantially match the thermal expansion characteristics of the substrate 201. The microcap 202 generally provides a hermetic seal to the volume 203 between the substrate 201 and the microcap 202, where the FBAR 100 is disposed. Further details of the microcap may be found, for example, U.S. Pat. No. 7,422,929, to Gallup, et al.; U.S. Pat. Nos. 6,429,511, 6,777,267, 8,102,044 and 8,232,845, to Ruby, et al.; and U.S. Pat. No. 8,680,944, to Ye, et al.; and U.S. Patent Application Publication No. 20120074555 to Snyder, et al. now U.S. Pat. No. 8,946,877 B2 The disclosures of the listed patents and patent application publication are specifically incorporated herein by reference.

The FBAR 100 includes acoustic stack 204 formed of multiple layers over the substrate 201 having an acoustic reflector 205 that comprises a cavity 206 formed in the substrate 201. In certain embodiments, the acoustic reflector 205 comprises the cavity 206 that is filled with material (not shown) useful in improving the acoustic isolation of the acoustic stack 204. In other embodiments, the acoustic reflector 205 comprises the cavity 206 that is filled with air, inert gasses, or is void (i.e., vacuum).

The acoustic stack 204 comprises the first electrode 101, a piezoelectric layer 207 disposed beneath the first electrode 101, and a second electrode 208 disposed beneath the piezoelectric layer 207. The second electrode 208 is disposed over the substrate 201, and extends over at least two sides of the acoustic reflector 205. Notably, an overlap of the acoustic reflector 205, the second electrode 208, the first electrode 101 and a piezoelectric layer 207 defines an active area of the FBAR 100.

A planarization layer (not shown) may also be provided over the substrate 201. In a representative embodiment, the planarization layer includes an etch resist borosilicate glass (NEBSG), for example. In general, planarization layer does not need to be present in the structure (as it increases overall processing cost), but when present, it may improve quality of growth of subsequent layers and simplify their processing.

The substrate 201 may be formed of various types of materials, including semiconductor materials compatible with semiconductor processes, such as silicon (Si), gallium arsenide (GaAs), indium phosphide (InP), or the like, which are useful for integrating connections and electronics, dissipating heat generated from a resonator, thus reducing size and cost, and providing a more robust device. Illustratively, the first electrode 101 and the second electrode 208 comprise molybdenum (Mo). Other materials may be used for the first electrode 101 and the second electrode 208, including but not limited to tungsten (W) or a bi-metal material.

In accordance with certain representative embodiments, the piezoelectric layer 207 may be an undoped layer of aluminum nitride (AlN). Alternatively, the piezoelectric layer 207 could be an undoped layer of zinc oxide (ZnO), barium strontium titanate (BST) or other piezoelectric material suitable for use as the piezoelectric layer 207. In other representative embodiments, the piezoelectric layer 207 comprises a rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN. Moreover, and as described more fully below, for a particular bandwidth, acoustic coupling coefficient ($kt^2$) value and a series resonance frequency ($F_s$) the thickness of the piezoelectric layer 207 of FBAR 100 of representative embodiments is thin compared to a known FBAR resonator that is not doped with a rare-earth element.

The piezoelectric layer 207 is doped with a particular atomic percent of a rare-earth element in order to provide a desired bandwidth and acoustic coupling coefficient for a particular series resonance frequency ($F_s$). As noted above, in certain embodiments, the doped piezoelectric material in the piezoelectric layer 207 comprises doped AlN. A number of Al atoms within the AlN crystal lattice are replaced with a rare-earth element at a predetermined percentage, referred to as a "doping element." Because the doping elements replace only Al atoms (e.g., of an Al target), the percentage of nitrogen atoms in the piezoelectric material remains substantially the same regardless of the amount of doping. As such, when percentages of doping elements are discussed herein, it is in reference to the total atoms (including nitrogen) of the AlN piezoelectric material, and is referred to herein as "atomic percentage."

In various embodiments, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material.

In accordance with certain representative embodiments, the piezoelectric layer 207 the atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%. So, for example, as described more fully below, if one of the Al targets used in the method of fabricating the piezoelectric layer 207 contains approximately 5 percent Sc, then the Al in the piezoelectric layer 207 has an atomic percentage of approximately 95.0%, while the Sc has an atomic percentage of approximately 5.0%. The atomic consistency of the piezoelectric layer 207 may then be represented as $Al_{0.95}Sc_{0.05}N$.

The cavity 206 may be formed using a sacrificial material, such as phosphosilicate glass (PSG), for example, which is subsequently removed. The second electrode 208 may be applied to the top surface of the substrate 201 and the sacrificial material initially filling the cavity 206, and the first electrode 101 may be applied to the top surface of the piezoelectric layer 207, respectively, using one of a number of known methods, such as described in the above incorporated U.S. patent application Ser. Nos. 14/161,564 and 13/662,460.

The cavity 206 is optionally lined with a layer 209. The layer 209 illustratively comprises a thermally conductive material. Notably, the thermally conductive material that comprises layer 209 often comprises an electrically conductive material as well. In certain representative embodiments, the layer 209 comprises one of molybdenum (Mo), copper (Cu), or tungsten (W). Alternatively, the layer 209 illustrative comprises AlN (or similar material), which is not substantially electrically conductive, but is comparatively thermally conductive (e.g., ranges from 40 to 280 W/K/m for AlN, compared to 150 W/K/m for silicon).

The FBAR structure 200 further comprises a via 210, which is disposed substantially directly beneath the acoustic reflector 205, which lies substantially directly beneath the FBAR 100 and extends through the substrate 201 between the acoustic reflector 205 and a contact pad 212 disposed over a backside surface 211 of the substrate 201 that opposes a topside surface 213 of the substrate 201, and over which the FBAR 100 is disposed. Generally, as used herein, the locating of the via 210 "substantially directly beneath" the FBAR 100 means the via 210 is disposed within a width "w" of the acoustic reflector 205 as depicted in FIG. 2. As such, the via 210 can thus be substantially directly beneath the acoustic reflector 205 as well, and can have a width or diameter that is less than or substantially equal to the width "w" of the acoustic reflector 205, which is approximately 500 μm or less, and is typically 300 μm or less. Similarly, the via 210 can have a length (i.e., the dimension into the plane of the page of FIG. 2) that is less than or equal to the length of the acoustic reflector, which is approximately 500 μm or less, and is typically 300 μm or less. However, and will be appreciated by one of ordinary skill in the art, locating the via 210 not within the width "w" of the acoustic reflector 205 can result in a lateral offset of the via 210 relative to the acoustic reflector 205, which ultimately results in an increase in the footprint and thus the required area of the FBAR 100 and its thermal, or thermal and electrical connection through the via.

The via 210 is generally cylindrical and has a diameter of approximately 10.0 μm to approximately 50 μm. Alternatively the via 210 can have a rectangular, square or polygonal cross-section, with its largest dimension (e.g., width) being approximately the same as the diameter noted above. As can be appreciated, the via 210 has a depth sufficient to contact layer 209 of the acoustic reflector 205. Generally, the via 201 has a depth commensurate with the thickness of the substrate, which can be in the range of approximately 80 μm to approximately 250 μm, minus the depth of the cavity 206, which can range from a few microns to tens of microns.

The location of the via 210 substantially directly beneath the cavity 206 also beneficially reduces the area required of the FBAR 100. Notably, in certain known electrical connections are made to FBARs through via (not shown) in a lid (e.g., microcap 202), which are referred to as "top-side" vias. In order to ensure hermeticity and in view of certain design rules regarding the spacing of the vias (e.g., to avoid ESD issues), the via is located laterally spaced from the FBAR, and requires certain features (e.g., so-called "gaskets" for the via(s) on the lid) to ensure hermeticity. These known structures also increase the overall chip "real estate" requirements, and ultimately increase the size of the devices (e.g., filters) comprising these known FBARs. By contrast, the via 210 is hermetic, having been made from an opening formed in the substrate 201 and being in direct contact with the layer 209. As such, no ambient elements can penetrate the via 210. Moreover, the "footprint" of the via 210 is located within the overall footprint of the FBAR 100, and is not laterally spaced at a location separated from the footprint of the FBAR 100. As demand for ever-reduced device real estate increases, the location of the via 210 substantially directly beneath the FBAR 100 provides clear benefits over known structures with electrical contacts to the FBAR located laterally away from the FBAR. Illustratively, the overall area of a die comprising a plurality of FBARs 100

(e.g., in a filter) in one or more FBAR structures 200 is reduced by approximately 15% to approximately 19% compared to known structures comprising "topside" vias. This also provides a shorter electrical path to external electrical connections compared to known connections to FBARs. Beneficially, providing a comparatively short electrical path ensures a reduced electrical resistance to make connections to the FBAR 100.

In certain representative embodiments, the via 210 comprises a metal, such as molybdenum (Mo), tungsten (W) or copper, or an alloy of a suitable material. As noted above, the via 210 generally provides both a thermal and electrical path between the FBAR 100 and the pillar 214. However, this is merely illustrative. Alternatively, the via 210 could provide only a thermal path between the FBAR 100 and the pillar 214. In this case, the via 210 may be thermally connected to the FBAR 100, but not electrically connected, and the and the electrical connection to the second electrode 208 is made by another path (not shown).

The via 210 is in thermal contact with the FBAR 100, and beneficially serves to dissipate heat between the FBAR 100 and an electrically conductive pillar ("pillar") 214 or other thermal sink disposed in another substrate 215 over which the FBAR structure 200 is disposed. The pillar 214 is illustratively a copper pillar, and may be a pillar as described in commonly owned U.S. Patent Application Publications 20130134560 now U.S. Pat. No. 8,536,707 B2 and 20120025370 now U.S. Pat. No. 8,344,504 B2 to Wholey, et al. and U.S. Patent Application Publication 20120025269 to Parkhurst, et al. now U.S. Pat. No. 8,314,472 B2 The disclosures of these patent application publications are specifically incorporated herein by reference.

As depicted in FIG. 2, in a representative embodiment, the thermal path between the via 210 and the FBAR 100 includes the layer 209, which is in contact with the second electrode 208. Generally, the thermal path between the via 210 and the FBAR 100 is also an electrical path, and serves to provide an electrical ground path between the second electrode 208 and the pillar 214. Alternatively, in an embodiment where the layer 209 is thermally but not substantially electrically conductive, the via 210 may provide only a thermal path from the FBAR 100 to the pillar 214, and the electrical connection to the second electrode 208 is made by another path (not shown).

Regardless if the via 210 is functioning as both and electrical and thermal path, or as a thermal path alone, the via 210 provides a path for dissipation of heat generated by the FBAR 100. Notably, as power requirements on acoustic resonators increase, the heat generated by the acoustic stack 204, during operation, increases as well. This heat can have an impact on the performance and ultimately the reliability of the FBAR 100. While the substrate 201 (e.g., silicon) can be made of a material that provides some heat dissipation, as greater power is demanded from FBAR 100, the thermal dissipation afforded by the substrate 201 is likely not sufficient. As such, the incorporation of the via 210, which comprises a material (e.g., a metal) having a comparatively high thermal conductivity in the FBAR structure 200 beneficially improves the dissipation of thermal energy generated by the FBAR 100 to a thermal sink, such as pillar 214. So, the via 210 and the substrate 201 (e.g., silicon), which is a very good heat dissipater, together provide an improved thermal path to dissipate the heat generated by the acoustic stack 204.

As noted above, the cavity 206 is formed using one of a number of known methods, details of which are described below. After its formation, the layer 209 may be formed in the cavity 206. After completion of the cavity 206, an opening is made in the substrate 201, and extends from the backside surface 211 to layer 209. As described more fully below, the opening can be made using one of a number of known methods, depending on the aspect ratio of the opening. If the aspect ratio of the opening is comparatively large, a known reaction ion etching (RIE) method, such as the so-called Bosch method, can be used to form the opening. Further details of fabricating the opening in the substrate 201 are described below.

After the opening is formed to have a depth great enough to reach the layer 209 and a width or diameter large enough to ensure sufficient surface area at the contact point of the layer 209 to provide sufficient large heat dissipation for the particular requirements of the FBAR 100, the opening is filled with the thermally conductive material, or electrically and thermally conductive material.

Figure 3:
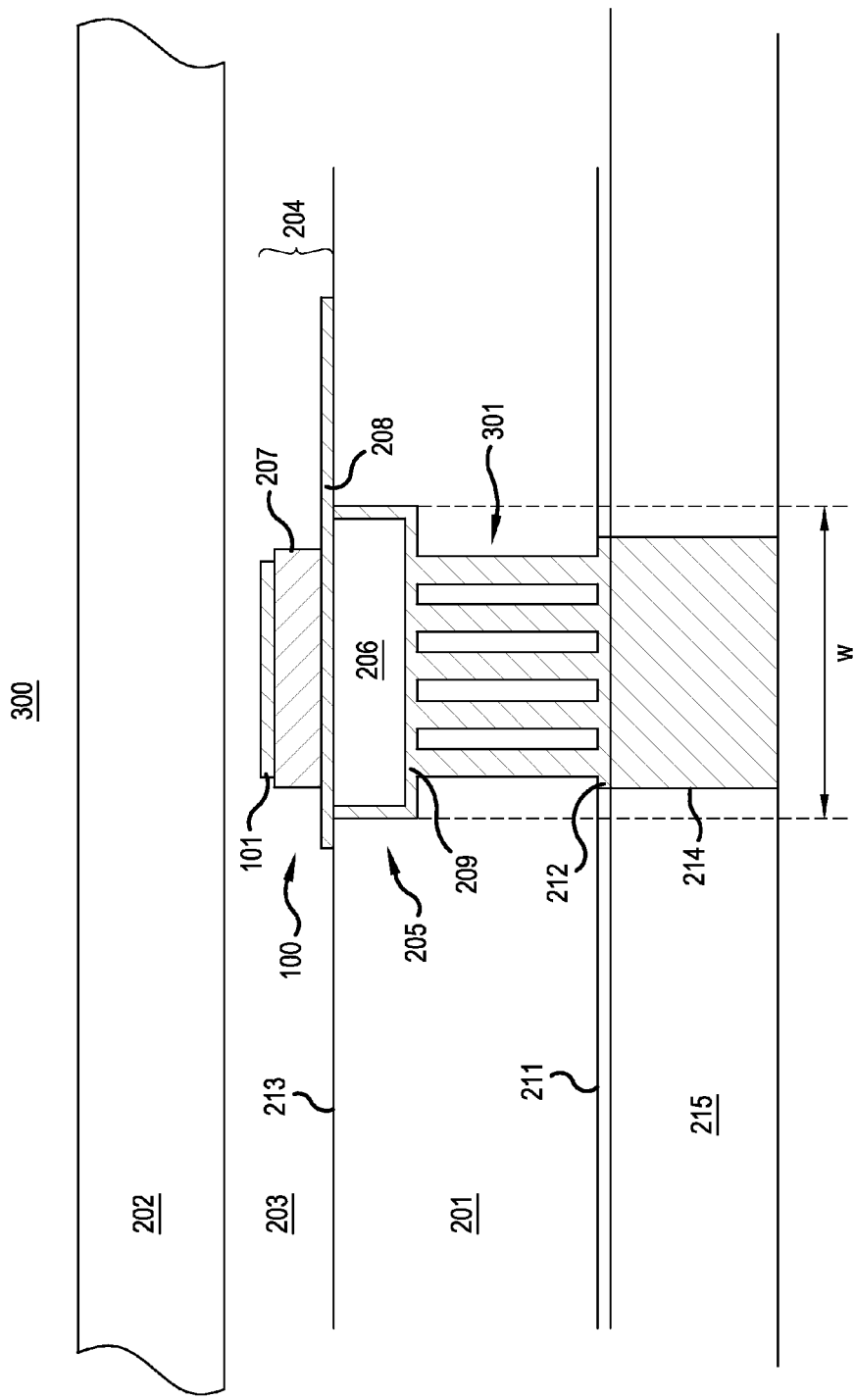
FIG. 3 is a cross-sectional view of an FBAR structure in accordance with a representative embodiment.

FIG. 3 shows a cross-sectional view of the FBAR structure 300 that comprises FBAR 100 in accordance with a representative embodiment. Many details of the FBAR structure 300 are common to the FBAR structure 200 described in connection with the representative embodiments of FIG. 2, and the FBAR 100 described in connection with the representative embodiments of FIG. 1, and are often no repeated.

The FBAR structure 300 comprises the FBAR 100 disposed over the substrate 201 and comprising the lid or microcap 202 disposed thereover. The FBAR 100 includes acoustic stack 204 formed of multiple layers over the substrate 201 having the acoustic reflector 205 that comprises the cavity 206 formed in the substrate 201. In certain embodiments, the acoustic reflector 205 comprises the cavity 206 that is filled with material (not shown) useful in improving the acoustic isolation of the acoustic stack 204, or improving dissipation of thermal energy (heat) generated by the FBAR 100.

A planarization layer (not shown) may also be provided over the substrate 201. The substrate 201 may be formed of various types of materials, including semiconductor materials compatible with semiconductor processes, such as silicon (Si), gallium arsenide (GaAs), indium phosphide (InP), or the like, which are useful for integrating connections and electronics, dissipating heat generated from a resonator, thus reducing size and cost, and providing a more robust device. Illustratively, the first electrode 101 and the second electrode 208 comprise molybdenum (Mo). Other materials may be used for the first electrode 101 and the second electrode 208, including but not limited to tungsten (W) or a bi-metal material.

In accordance with certain representative embodiments, the piezoelectric layer 207 may be an undoped layer of aluminum nitride (AlN). In other representative embodiments, the piezoelectric layer 207 comprises a rare-earth element doped piezoelectric material (piezoelectric layer), such as AlScN as described more fully above.

As noted above, the cavity 206 may be formed using a sacrificial material, such as phosphosilicate glass (PSG), for example, which is subsequently removed. The second electrode 208 may be applied to the top surface of the substrate 201 and the sacrificial material initially filling the cavity 206, and the first electrode 101 may be applied to the top surface of the piezoelectric layer 207, respectively, using one of a number of known methods, such as described in the above incorporated U.S. patent application Ser. Nos. 14/161, 564 and 13/662,460.

The cavity 206 is optionally lined with the layer 209. The layer 209 illustratively comprises a thermally conductive material. Notably, the thermally conductive material that comprises layer 209 often comprises an electrically conductive material as well. In certain representative embodiments, the layer 209 comprises one of molybdenum (Mo), copper (Cu), or tungsten (W). Alternatively, and as noted above the layer 209 may comprise AlN, which is not substantially electrically conductive, but is comparatively thermally conductive (approximately 280 W/K/m compared to 150 W/K/m for silicon).

The FBAR structure 300 further comprises a plurality of vias 301, which are disposed substantially directly beneath the cavity 206 and extend through the substrate 201 between the acoustic reflector 205 and a contact pad 212 disposed over a backside surface 211 of the substrate 201 that opposes a topside surface 213 of the substrate 201, and over which the FBAR 100 is disposed. Generally, as used herein, the locating of the plurality of vias 301 "substantially directly beneath" the FBAR 100 means the via 210 is disposed within a width "w" of the acoustic reflector 205 as depicted in FIG. 3. As such, the via 210 can thus be substantially directly beneath the acoustic reflector 205 as well, and can have a width or diameter that is less than or substantially equal to the width "w" of the acoustic reflector 205. However, and will be appreciated by one of ordinary skill in the art, locating the plurality of vias 301 not within the width "w" of the acoustic reflector 205 can result in a lateral offset of one or more of the plurality of vias 301 relative to the acoustic reflector 205, which ultimately results in an increase in the footprint and thus the required area of the FBAR 100 and its thermal, or thermal and electrical connection through the via. Moreover, like the "footprint" of via 210, the "footprint" of the vias 301 is located within the overall footprint of the FBAR 100. As demand for ever-reduced device real estate increases, the location of the vias 301 substantially directly beneath the FBAR 100 provides clear benefits over known structures with electrical contacts to the FBAR located laterally away from the FBAR. Illustratively, the overall area of a die comprising a plurality of FBARs 100 (e.g., in a filter) in one or more FBAR structures 200 is reduced by approximately 15% to approximately 19% compared to known structures comprising "topside" vias. This also provides a short electrical path to external electrical connections compared to known connections to FBARs. Beneficially, providing a comparatively short electrical path ensures a reduced electrical resistance to make connections to the FBAR 100.

Each of the plurality of vias 301 is generally cylindrical and has a diameter of approximately 10 μm to approximately 50 μm. Alternatively each of the plurality of vias 301 can have a rectangular, square or polygonal cross-section, with its largest dimension (e.g., width) being approximately the same as the diameter noted above. In accordance with a representative embodiment, each of the plurality of vias 301 can have a length (i.e., the dimension into the plane of the page of FIG. 3) that is less than or equal to the length of the acoustic reflector, which is approximately 500 μm or less, and is typically 300 μm or less.

Again, and will be appreciated by one of ordinary skill in the art, locating all of the plurality of vias 301 not within the width "w" of the acoustic reflector 205 can result in a lateral offset of some of the plurality of vias 301 relative to the acoustic reflector 205, which ultimately results in an increase in the footprint and thus the required area of the FBAR 100 and its thermal, or thermal and electrical connection through the via.

As can be appreciated, each of the plurality of vias 301 has a depth sufficient to contact layer 209 of the acoustic reflector 205 and post 401. Generally, each of the vias 311 has a depth commiserate with the thickness of the substrate 201, which is in the range of approximately 80 μm to approximately 200 μm, minus the depth of the cavity 206, which can range from a few microns to tens of microns.

The location of the plurality of vias 301 substantially directly beneath the FBAR 100 also beneficially reduces the area required of the FBAR 100. Notably, in certain known electrical connections are made to FBARs through via (not shown) in a lid (e.g., microcap 202), which are referred to as "top-side" vias. In order to ensure hermeticity and in view of certain design rules regarding the spacing of the vias (e.g., to avoid ESD issues), the via is located laterally spaced from the FBAR, and requires certain features (e.g., so-called "gaskets" for the via(s) on the lid) to ensure hermeticity. These known structures also increase the overall chip "real estate" requirements, and ultimately increase the size of the devices (e.g., filters) comprising these known FBARs. By contrast, each of the plurality of vias 301 is hermetic, having been made from an opening formed in the substrate 201 and being in direct contact with the layer 209. As such, no ambient elements can penetrate any of the plurality of vias 301. Moreover, the "footprint" of the plurality of vias 301 is comparatively small, is located within the overall footprint of the FBAR 100, and, as such, is not laterally spaced at a location separated from the footprint of the FBAR 100. As demand for ever-reduced device real estate increases, the location of the plurality of vias 301 substantially directly beneath the FBAR 100 provides clear benefits over known structures with electrical contacts to the FBAR located laterally away from the FBAR. Illustratively, the overall area of a die comprising a plurality of FBARs 100 (e.g., in a filter) in one or more FBAR structures 200 is reduced by approximately 15% to approximately 19% compared to known structures comprising "topside" vias.

Each of the plurality of vias 301 is in thermal contact with the FBAR 100, and beneficially serves to dissipate heat between the FBAR 100 and the pillar 214 or other thermal sink disposed in another substrate 215 over which the FBAR structure 200 is disposed. The pillar 214 is illustratively a copper pillar, and may be a pillar as described in commonly owned U.S. Patent Application Publications 20130134560 and 20120025370 to Wholey, et al. and U.S. Patent Application Publication 20120025269 to Parkhurst, et al. The disclosures of these patent application publications are specifically incorporated herein by reference.

In certain representative embodiments, each of the plurality of vias 301 comprises a metal, such as molybdenum (Mo), tungsten (W) or copper, or an alloy of a suitable material. As noted above, each of the plurality of vias 301 generally provides both a thermal and electrical path between the FBAR 100 and the pillar 214. However, this is merely illustrative. Alternatively, one or more of the plurality of vias 301 could provide only a thermal path between the FBAR 100 and the pillar 214. In this case, the one or more of the plurality of vias 301 may be thermally connected to the FBAR 100, but not electrically connected, and the electrical connection to the second electrode 208 is made by another path (not shown).

As depicted in FIG. 3, in a representative embodiment, the thermal path between the plurality of vias 301 and the FBAR 100 includes the layer 209, which is in contact with the second electrode 208. Generally, the thermal path between each of the plurality of vias 301 and the FBAR 100 is also an electrical path, and serves to provide an electrical ground path between the second electrode 208 and the pillar 214.

Regardless if the plurality of vias 301 are functioning as both and electrical and thermal path, or as a thermal path alone, each of the plurality of vias 301 provides a path for dissipation of heat generated by the FBAR 100. Notably, as power requirements on acoustic resonators increase, the heat generated by the acoustic stack 204, during operation, increases as well. This heat can have an impact on the performance and ultimately the reliability of the FBAR 100. While the substrate 201 (e.g., silicon) can be made of a material that provides some heat dissipation, as greater power is demanded from FBAR 100, the thermal dissipation afforded by the substrate 201 is likely not sufficient. As such, the incorporation of the plurality of vias 301, each of which comprises a material (e.g., a metal) having a comparatively high thermal conductivity in the FBAR structure 200 beneficially improves the dissipation of thermal energy generated by the FBAR 100 to a thermal sink, such as pillar 214. So, the plurality of vias 301 and the substrate 201 (e.g., silicon), which is a very good heat dissipater, together provide an improved thermal path to dissipate the heat generated by the acoustic stack 204.

FIG. 4A shows a cross-sectional view of the FBAR structure 400 that comprises FBAR 100 in accordance with a representative embodiment. Many details of the FBAR structure 400 are common to the FBAR structures 200, 300 described in connection with the representative embodiments of FIGS. 2 and 3, and the FBAR 100 described in connection with the representative embodiments of FIG. 1, and are often no repeated.

The FBAR structure 400 comprises the FBAR 100 disposed over the substrate 201 and comprising the lid or microcap 202 disposed thereover. The FBAR 100 includes acoustic stack 204 formed of multiple layers over the substrate 201 having the acoustic reflector 205 that comprises the cavity 206 formed in the substrate 201. In certain embodiments, the acoustic reflector 205 comprises the cavity 206 that is filled with material (not shown) useful in improving the acoustic isolation of the acoustic stack 204, or improving dissipation of thermal energy (heat) generated by the FBAR 100.

A planarization layer (not shown) may also be provided over the substrate 201. The substrate 201 may be formed of various types of materials, including semiconductor materials compatible with semiconductor processes, such as silicon (Si), gallium arsenide (GaAs), indium phosphide (InP), or the like, which are useful for integrating connections and electronics, dissipating heat generated from a resonator, thus reducing size and cost, and providing a more robust device. Illustratively, the first electrode 101 and the second electrode 208 comprise molybdenum (Mo). Other materials may be used for the first electrode 101 and the second electrode 208, including but not limited to tungsten (W) or a bi-metal material.

In accordance with certain representative embodiments, the piezoelectric layer 207 may be an undoped layer of aluminum nitride (AlN). In other representative embodiments, the piezoelectric layer 207 comprises a rare-earth element doped piezoelectric material (piezoelectric layer), such as AlScN as described more fully above.

As described more fully below, the cavity 206 may be formed using a sacrificial material, such as phosphosilicate glass (PSG), for example, which is subsequently removed. The second electrode 208 may be applied to the top surface of the substrate 201 and the sacrificial material initially filling the cavity 206, and the first electrode 101 may be applied to the top surface of the piezoelectric layer 207, respectively, using one of a number of known methods, such as described in the above incorporated U.S. patent application Ser. Nos. 14/161,564 and 13/662,460, and as described more fully below.

The cavity 206 is optionally lined with the layer 209. The layer 209 illustratively comprises a thermally conductive material. Notably, the thermally conductive material that comprises layer 209 often comprises an electrically conductive material as well. In certain representative embodiments, the layer 209 comprises one of molybdenum (Mo), copper (Cu), or tungsten (W). Alternatively, and as noted above the layer 209 may comprise AlN, which is not substantially electrically conductive, but is comparatively thermally conductive (approximately 280 W/K/m compared to 150 W/K/m for silicon).

The FBAR structure 400 further comprises the plurality of vias 301, which are disposed substantially directly beneath the acoustic reflector 205, which is disposed substantially directly beneath the FBAR 100, and extend through the substrate 201 between the acoustic reflector 205 and the contact pad 212 disposed over the backside surface 211 of the substrate 201 that opposes a topside surface 213 of the substrate 201, and over which the FBAR 100 is disposed. Notably, rather than a plurality of vias 301, a single via (e.g., via 210) may be incorporated into FBAR structure 400.

As noted above, the locating of the plurality of vias 301 (or the via 210) "substantially directly beneath" the FBAR 100 means the plurality of vias 301 is disposed within a width "w" of the acoustic reflector 205 as depicted in FIG. 4A. As such, the plurality of vias 301 can thus be substantially directly beneath the acoustic reflector 205 as well, and can have a width or diameter that is less than or substantially equal to the width "w" of the acoustic reflector 205. However, and will be appreciated by one of ordinary skill in the art, locating the plurality of vias 301 not within the width "w" of the acoustic reflector 205 can result in a lateral offset of one or more of the plurality of vias 301 relative to the acoustic reflector 205, which ultimately results in an increase in the footprint and thus the required area of the FBAR 100 and its thermal, or thermal and electrical connection through the via.

Each of the plurality of vias 301 is generally cylindrical and has a diameter of approximately 10.0 μm to approximately 50.0 μm. Alternatively each of the plurality of vias 301 can have a rectangular, square or polygonal cross-section, with its largest dimension (e.g., width) being approximately the same as the diameter noted above.

In accordance with a representative embodiment, each of the plurality of vias 301 can have a length (i.e., the dimension into the plane of the page of FIG. 3) that is less than or equal to the length of the acoustic reflector, which is approximately 500 μm or less, and is typically 300 μm or less.

As can be appreciated, each of the plurality of vias 311 has a depth sufficient to contact layer 209 of the acoustic reflector 205. Generally, each of the vias 311 has a depth commiserate with the thickness of the substrate 201, which is in the range of approximately 80 μm to approximately 200 m, minus the depth of the cavity 206, which can range from a few microns to tens of microns.

The location of the plurality of vias 301 substantially directly beneath the FBAR 100 also beneficially reduces the area required of the FBAR 100. Notably, in certain known electrical connections are made to FBARs through via (not shown) in a lid (e.g., microcap 202), which are referred to as "top-side" vias. In order to ensure hermeticity and in view of certain design rules regarding the spacing of the vias (e.g., to avoid ESD issues), the via is located laterally spaced from the FBAR, and requires certain features (e.g., so-called "gaskets" for the via(s) on the lid) to ensure hermeticity. These known structures also increase the overall chip "real estate" requirements, and ultimately increase the size of the devices (e.g., filters) comprising these known FBARs. By contrast, each of the plurality of vias 301 is hermetic, having been made from an opening formed in the substrate 201 and being in direct contact with the layer 209. As such, no ambient elements can penetrate any of the plurality of vias 301. Moreover, the "footprint" of the plurality of vias 301 is comparatively small, is located within the overall footprint of the FBAR 100, and, as such, is not laterally spaced at a location separated from the footprint of the FBAR 100. As demand for ever-reduced device real estate increases, the location of the plurality of vias 301 substantially directly beneath the FBAR 100 provides clear benefits over known structures with electrical contacts to the FBAR located laterally away from the FBAR. Illustratively, the overall area of a die comprising a plurality of FBARs 100 (e.g., in a filter) in one or more FBAR structures 200 is reduced by approximately 15% to approximately 19% compared to known structures comprising "topside" vias. As noted above, this also provides a short electrical path to external electrical connections compared to known connections to FBARs. Beneficially, providing a comparatively short electrical path ensures a reduced electrical resistance to make connections to the FBAR 100.

Each of the plurality of vias 301 is in thermal contact with the FBAR 100, and beneficially serves to dissipate heat between the FBAR 100 and the pillar 214 or other thermal sink disposed in another substrate 215 over which the FBAR structure 200 is disposed. The pillar 214 is illustratively a copper pillar, and may be a pillar as described in commonly owned U.S. Patent Application Publications 20130134560 and 20120025370 to Wholey, et al. and U.S. Patent Application Publication 20120025269 to Parkhurst, et al. The disclosures of these patent application publications are specifically incorporated herein by reference.

In certain representative embodiments, each of the plurality of vias 301 comprises a metal, such as molybdenum (Mo), tungsten (W) or copper, or an alloy of a suitable material. As noted above, each of the plurality of vias 301 generally provides both a thermal and electrical path between the FBAR 100 and the pillar 214. However, this is merely illustrative. Alternatively, one or more of the plurality of vias 301 could provide only a thermal path between the FBAR 100 and the pillar 214.

In addition to the plurality of vias 301 (or the via 210), the FBAR structure 400 comprises a post 401 disposed substantially in the center of the cavity 206. The post 401 extends from layer 209 to a lower surface 404 of second electrode 208, and is in thermal contact with the second electrode 208 and the layer 209. As such, the post 401 provides an additional path to dissipate heat from the FBAR 100 through the plurality of vias 301 (or via 210) to the pillar 214.

The post 401 comprises an outer portion 402 and an inner portion 403. The outer portion 402 illustratively comprises a material that is either thermally conductive, or electrically or thermally conductive. As will become clearer below, the inner portion 403 comprises the same material (e.g., silicon) as the substrate 201. Notably, the heat generated towards the center of the FBAR 100 can be the greatest in the FBAR 100. As such, locating the post 401 substantially in the center of the cavity 206 positions the post to make contact with the FBAR 100 at a location where heat generation can be greatest, thereby locating the post in a location where it can effect optimal heat dissipation.

In certain representative embodiments, the outer portion 402 comprises one of molybdenum (Mo), copper (Cu), or tungsten (W). Alternatively, the outer portion 402 may comprise a material that is thermally conductive, but not substantially electrically conductive (e.g., AlN, which is not substantially electrically conductive, but is comparatively thermally conductive (approximately 280 W/K/m compared to 150 W/Km for silicon)). Moreover, the inner portion 403, which is, for example, silicon, may also provides a thermally conductive path for heat dissipation.

As depicted in FIG. 4A, in a representative embodiment, the thermal path between the plurality of vias 301 and the FBAR 100 includes the layer 209, which is in contact with the second electrode 208 through direct contact, and through indirect contact by way of the post 401. Generally, the thermal path between each of the plurality of vias 301 and the FBAR 100 is also an electrical path, and serves to provide an electrical ground path between the second electrode 208 and the pillar 214.

Regardless if the plurality of vias 301 are functioning as both and electrical and thermal path, or as a thermal path alone, each of the plurality of vias 301 provides a path for dissipation of heat generated by the FBAR 100. Notably, as power requirements on acoustic resonators increase, the heat generated by the acoustic stack 204, during operation, increases as well. This heat can have an impact on the performance and ultimately the reliability of the FBAR 100. While the substrate 201 (e.g., silicon) can be made of a material that provides some heat dissipation, as greater power is demanded from FBAR 100, the thermal dissipation afforded by the substrate 201 is likely not sufficient. As such, the incorporation of the plurality of vias 301, each of which comprises a material (e.g., a metal) having a comparatively high thermal conductivity in the FBAR structure 200 beneficially improves the dissipation of thermal energy generated by the FBAR 100 to a thermal sink, such as pillar 214. So, the plurality of vias 301 and the substrate 201 (e.g., silicon), which is a very good heat dissipater, together provide an improved thermal path to dissipate the heat generated by the acoustic stack 204.

Figure 4B:
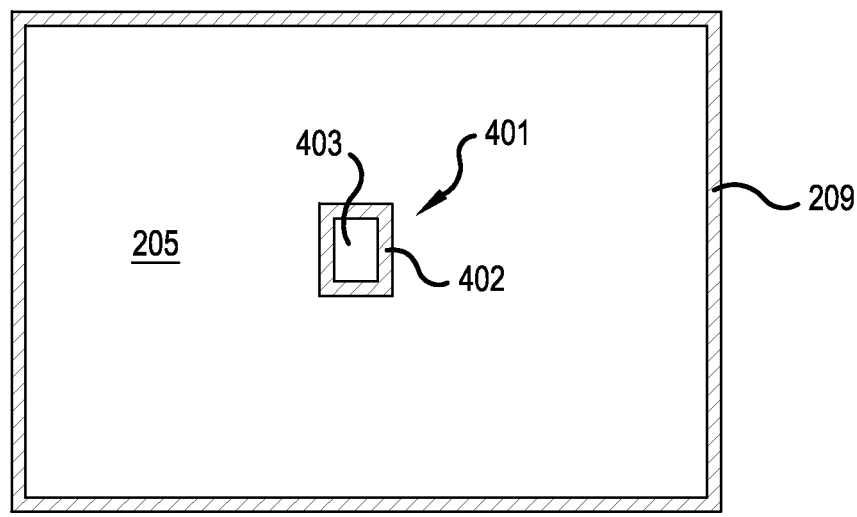
FIG. 4B is a cross-sectional view of the acoustic resonator of FIG. 4A taken along line 5A-5A.

FIG. 4B is a cross-sectional view of the acoustic reflector 205 of FIG. 4A taken along line 5A-5A. The acoustic reflector 205 comprises the post 401 disposed substantially in the (geometric) center of the cavity 206. As described more fully below, the post 401 may be formed when the acoustic reflector 205 is formed and by the same method, and has a height that is proportional to the depth of the cavity 206. Illustratively, the post 401 has a rectangular cross-section with a width and height of approximately 10 µm and approximately 10 µm, respectively, or greater. Alternatively, the post 401 could be formed by a dry reactive ion etching (DRIE) sequence (e.g., using the Bosch method) and have a width and height proportional to the ratio of the DRIE etch. For example, a DRIE etch ratio of 10:1 would produce a post having a height of approximately 10 µm and width of approximately 1 µm. The rectangular cross-section of the post 401 is merely illustrative, and the post could be circular, square or polygonal cross-section, with its largest dimension (e.g., width) being approximately 10 µm or greater. Naturally, the thickness of the outer portion 402 would be the same regardless of the shape of the post, and the dimensions of the inner portion 403 would be proportional to the dimensions of the post 401.

FIG. 5A-5I are cross-sectional views of a fabrication sequence for forming an FBAR structure in accordance with a representative embodiment. Often, the methods used in various steps to form the structures described below are known, and described in one of more of the documents incorporated by reference above. Such methods are thus briefly described. Notably, the fabrication sequence is directed to the fabrication of the FBAR structure 400, which includes post 401. As should be appreciated by one of ordinary skill in the art, the methods of the fabrication sequence can be applied to fabricate the FBAR structures 200, 300 by skipping the fabrication sequence to form the post. Finally, many details of the FBAR structures 200~400 are common to those described above, and are not repeated to avoid obscuring the description of the fabrication sequence of the presently described representative embodiments.

FIG. 5A shows a substrate 500 after etching a cavity 502 and an inner portion 503 according to a known masking and etching sequence. As will be appreciated, embodiments not comprising the post 401 would not include the formation of the inner portion 503 and its subsequent processing. Rather, the cavity 502 would be formed and the subsequent fabrication steps to form a layer (not shown in FIG. 5A) in the cavity 502, an FBAR (not shown in FIG. 5A) and via(s) (not shown in FIG. 5A) would proceed as described below.

FIG. 5B shows the formed layer 504 provided over the surface of the cavity 502 and the inner portion 503. As will become clearer as the present description continues, the layer 504 forms layer 209 of the acoustic reflector 205, and the outer portion 402 of the post, with the inner portion 503 forming the inner portion 403 of the post. The fabrication sequence used to form the layer 504 depends on the material selected for this layer. First, an adhesion layer (not shown) is formed over the upper surface of cavity 502 and the outer surface of the inner portion 503 using a known method. Illustrative, the adhesion layer may be titanium (Ti), or tungsten (W) or an Ti/W alloy. Next, if titanium or tungsten is selected for layer 504, a known deposition method is used to provide the layer. Illustratively, a layer of titanium or tungsten can be sputtered onto the adhesion layer, having a thickness of approximately 500 Å to approximately 2500 Å. Copper (Cu) could be plated to provide layer 504. In such an embodiment, a layer of copper, having a thickness of 500 Å to approximately 2500 Å, would first be sputtered over the adhesion layer, followed by a plating sequence to provide the layer 504 of copper by known methods. Illustratively, the copper can be plated to a thickness in the range of approximately 1.0 µm to on the order of 10.0 µm.

FIG. 5C shows the results of a first chemical mechanical polishing (CMP) step. The first CMP removes layer 504 from the substrate and the inner portion 503 and exposes an upper surface 505 of the substrate 501, and the inner portion 503.

FIG. 5D shows the deposition of a sacrificial layer 506 over the layer 504 and in the cavity 502. The sacrificial layer 506 is illustratively phosphosilicate glass (PSG) or other material that can be removed after formation of other components (e.g., FBAR 100) over the cavity 502.

FIG. 5E shows the results of a second CMP step. The second CMP removes the sacrificial layer 506 from over the substrate 501 and results in the sacrificial layer 506 being substantially flush with the exposed upper surface 505 of the substrate.

FIG. 5F shows the resulting structure after the formation of an FBAR 508 over the sacrificial layer 506 (not shown in FIG. 5F), which is removed after the FBAR is complete to reveal cavity 502. Moreover, FIG. 5F shows the resulting structure after the formation of the microcap 202 over the FBAR 508 and substrate 501.

Figure 5G:
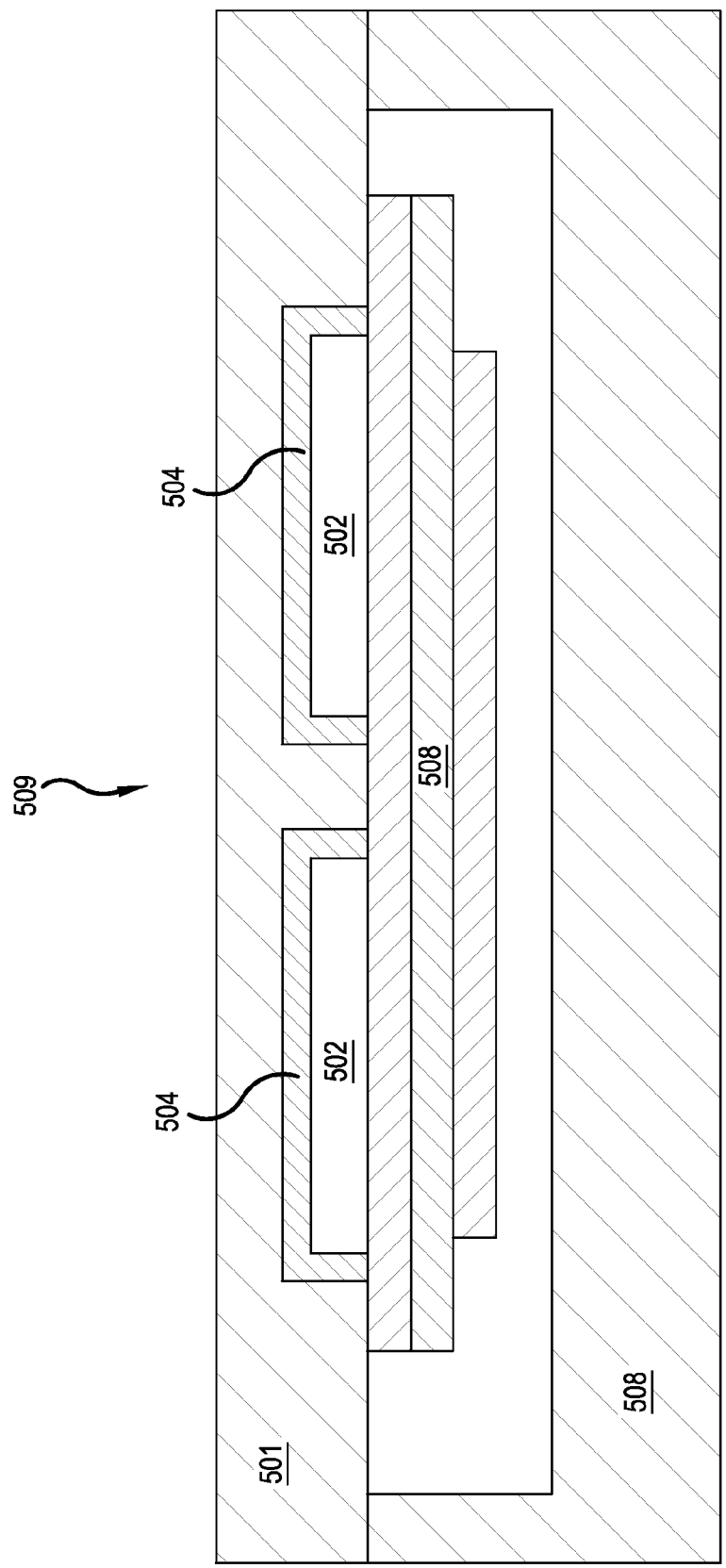

FIG. 5G shows the "flipping" of the structure followed by a backgrinding sequence 509 to reduce the thickness of the substrate 501 for further processing.

Figure 5H:
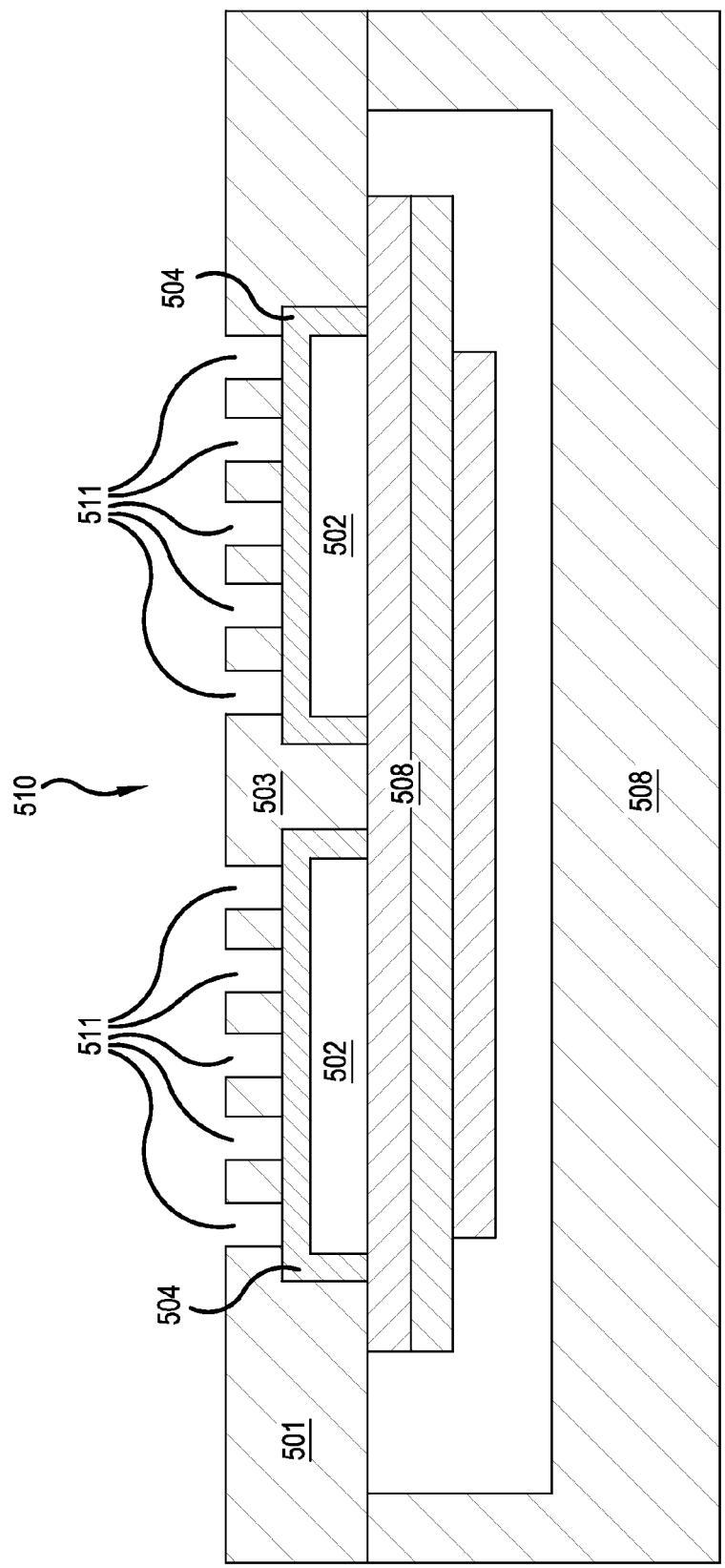

FIG. 5H shows the formation of a plurality of openings 511 in the substrate 501 and substantially directly beneath the cavity 502, comprising the layer 504, and therefore substantially directly beneath the FBAR 508. The plurality of openings 511 is made by a known etching technique depicted by 510. The etching technique may be, for example, a DRIE etching method or the so-called Bosch method to beneficially provide a comparatively high aspect ratio for each of the plurality of openings 511. Notably, if a single via is desired, only one opening is provided. This single opening could be fabricated using the DRIE etching method used to form the plurality of openings 511. In a representative embodiment, each of the plurality of openings 511 is substantially cylindrical and has a diameter of approximately 10.0 µm to approximately 50.0 µm. Alternatively each of the plurality of openings 511 can have a rectangular, square or polygonal cross-section, with its largest dimension (e.g., width) being approximately the same as the diameter noted above. Notably, if a single via were desired, the single opening would have a diameter, or greatest dimension depending on its shape, of approximately 10.0 µm to approximately 300 µm, where the upper limit is approximately the width of the cavity 502.

Figure 5I:
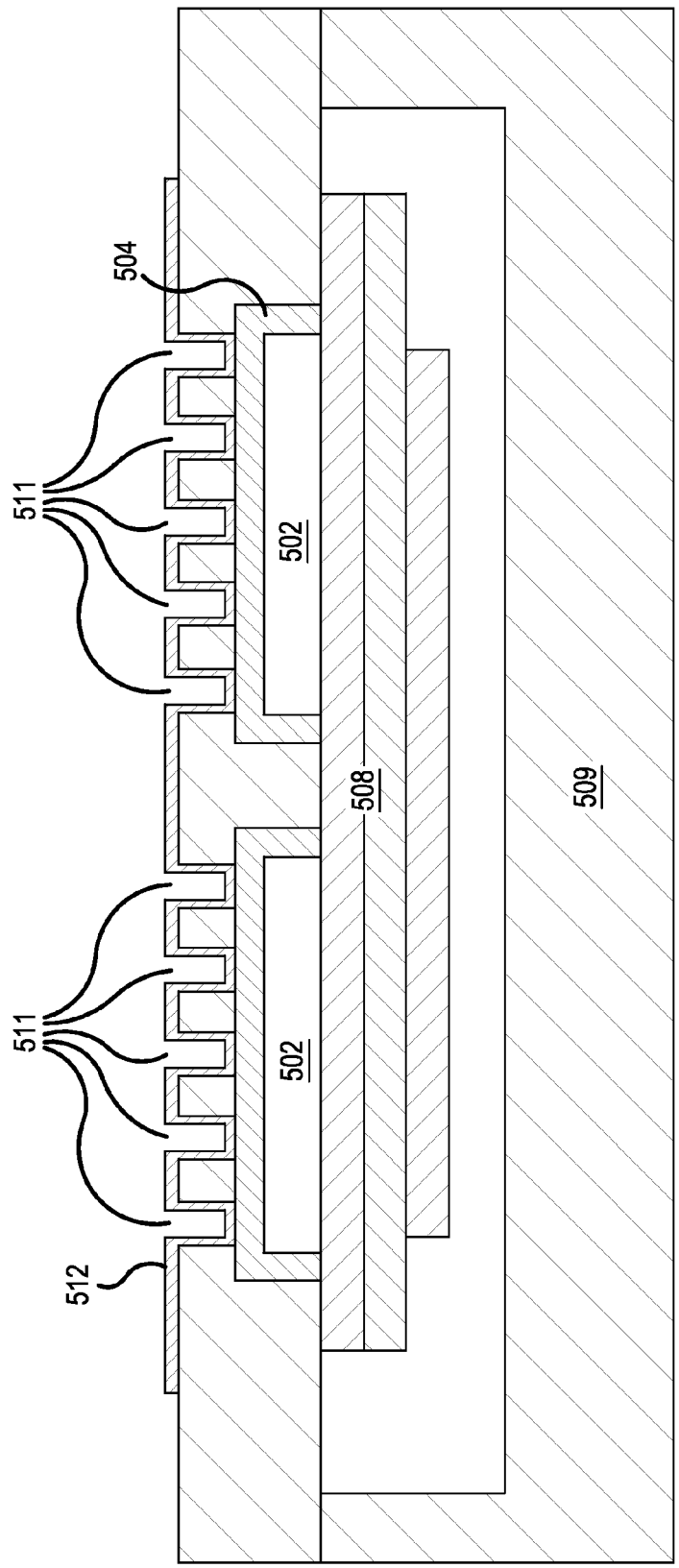

FIG. 5I shows the deposition or plating of a layer 512 in each of the openings 511 and over the substrate 501. The layer 512 comprises the adhesion layer and the initially deposited or plated layer of material used to fill each of the vias formed in the openings 511. Notably, the layer 512 is formed in the same way that the layer 504 is formed with first and adhesion layer (not shown) and either the sputtered electrically and thermally conductive layer (e.g., Ti or W) or the plated electrically and thermally conductive layer (e.g., copper) partially provided in the openings. The deposition or plating sequence would continue until each of the openings has sufficient metallization to provide acceptable electrical and thermal conductivity. The vias could be substantially filled with metal, but a complete filling is not mandatory. Again, rather than a plurality of vias being formed in the plurality of openings 511, a single via could be formed in a single opening (e.g., as shown in FIG. 2).

Figure 6:
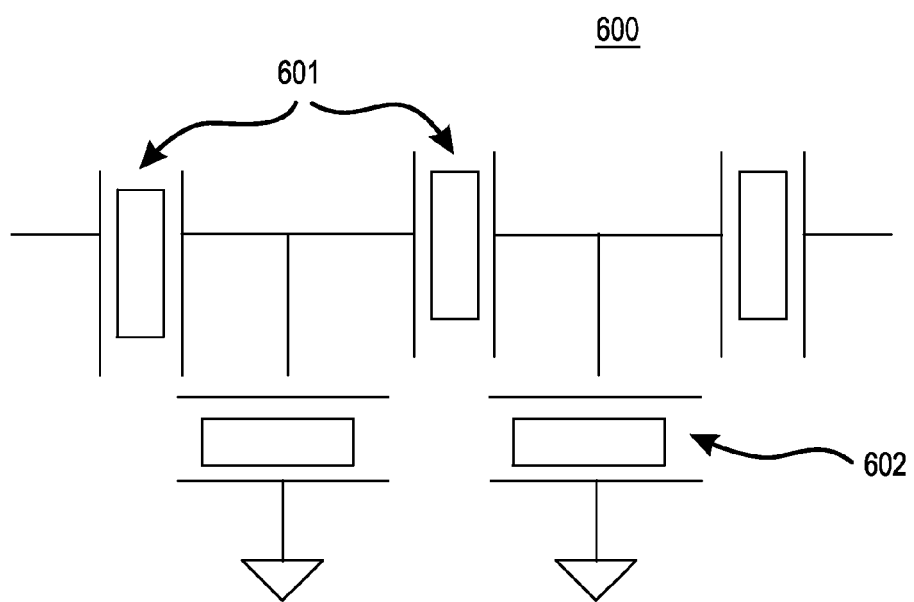
FIG. 6 is a simplified block diagram of an electrical filter in accordance with a representative embodiments.

As noted above, when connected in a selected topology, a plurality of FBARs 100 can function as an electrical filter. FIG. 6 shows a simplified schematic block diagram of an electrical filter 600 in accordance with a representative embodiment. The electrical filter 600 comprises series acoustic resonators 601 and shunt acoustic resonators 602. The series resonators 601 and shunt resonators 602 may comprise the FBAR 100 disposed in an FBAR structure 200, 300, 400 described in connection with the representative embodiments of FIGS. 2~4. The electrical filter 600 is commonly referred to as a ladder filter, and may be used for example in duplexer applications. Further details of a ladder-filter arrangement may be as described, for example, in above-referenced U.S. Pat. No. 5,910,756 to Ella, and U.S. Pat. No. 6,262,637 to Bradley, et al. It is emphasized that the topology of the electrical filter 600 is merely illustrative and other topologies are contemplated. Moreover, the FBAR structures of the representative embodiments are contemplated in a variety of applications besides duplexers.

One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A film bulk acoustic resonator (FBAR) structure, comprising:
   an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector;
   a via disposed substantially directly beneath the FBAR, and being in thermal contact with the second electrode; and
   a thermally and electrically conductive layer disposed on at least one side of the acoustic reflector, the thermally and electrically conductive layer being in thermal contact with the second electrode.

2. An FBAR structure as claimed in claim 1, further comprising a post disposed in the acoustic reflector, the post extending between and being thermally connected to the second electrode and the via.

3. An FBAR structure as claimed in claim 2, wherein the post is electrically conducting and is in electrical contact with the second electrode and the via.

4. An FBAR structure as claimed in claim 1, wherein the thermally and electrically conductive layer comprises one of molybdenum, copper or tungsten.

5. An FBAR structure as claimed in claim 1, wherein the via is in thermal contact with the second electrode through the thermally and electrically conductive layer.

6. An FBAR structure as claimed in claim 1, wherein the via is in thermal and electrical contact with the second electrode through the thermally and electrically conductive layer.

7. An electrical filter comprising the FBAR structure of claim 1.

8. An FBAR structure as claimed in claim 1, wherein at least one rare earth element is incorporated into a crystal lattice of the piezoelectric layer.

9. An FBAR structure as claimed in claim 8, wherein the at least one rare earth element comprises scandium (Sc).

10. An FBAR structure as claimed in claim 8, wherein the at least one rare earth element comprise two or more rare earth elements incorporated into the crystal lattice of the piezoelectric layer.

11. An FBAR structure as claimed in claim 10, wherein the at least two rare earth elements comprises scandium (Sc) and erbium (Er).

12. An FBAR structure as claimed in claim 11, wherein the at least two rare earth elements further comprises yttrium (Y).

13. A film bulk acoustic resonator (FBAR) structure, comprising:
   an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector;
   a plurality of vias, each of the plurality of vias being disposed substantially directly beneath the FBAR, and being in thermal contact with the second electrode; and
   a thermally and electrically conductive layer in electrical contact with the second electrode.

14. An FBAR structure as claimed in claim 13, wherein the thermally and electrically conductive layer is disposed on at least one side of the acoustic reflector, the thermally and conductive layer being in thermal contact with the second electrode.

15. An FBAR structure as claimed in claim 13, wherein each of the plurality of vias is in thermal contact with the second electrode through the thermally and electrically conductive layer.

16. An FBAR structure as claimed in claim 13, wherein at least one rare earth element is incorporated into a crystal lattice of the piezoelectric layer.

17. An FBAR structure as claimed in claim 16, wherein the at least one rare earth element comprises scandium (Sc).

18. An FBAR structure as claimed in claim 16, wherein the at least one rare earth element comprise two or more rare earth elements incorporated into the crystal lattice of the piezoelectric layer.

19. An FBAR structure as claimed in claim 18, wherein the at least two rare earth elements comprises scandium (Sc) and erbium (Er).

20. An FBAR structure as claimed in claim 18, wherein the at least two rare earth elements further comprises yttrium (Y).

21. An FBAR structure as claimed in claim 13, further comprising a post disposed in the acoustic reflector, the post extending between and being thermally connected to the second electrode and at least one of the plurality of vias.

22. An FBAR structure as claimed in claim 21, wherein the post is electrically conducting and is in electrical contact with the second electrode and the at least one of the plurality of vias.

23. An electrical filter comprising the FBAR structure of claim 13.

24. A film bulk acoustic resonator (FBAR) structure, comprising:
   an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector;
   a via disposed substantially directly beneath the FBAR, and being in thermal contact with the second electrode; and
   a substrate in which the acoustic reflector is disposed, and through which the via extends.

25. An FBAR structure as claimed in claim 24, further comprising a thermally conductive layer disposed on at least one side of the acoustic reflector, the thermally conductive layer being in thermal contact with the second electrode.

26. An FBAR structure as claimed in claim 25, wherein the thermally conductive layer is electrically conductive, and is in electrical contact with the second electrode.

27. An FBAR structure as claimed in claim 26, wherein is the thermally and electrically conductive layer comprises one of molybdenum, copper or tungsten.

28. An FBAR structure as claimed in claim 26, wherein the via is in thermal and electrical contact with the second electrode through the thermally and electrically conductive layer.

29. An FBAR structure as claimed in claim 25, wherein the via is in thermal contact with the second electrode through the thermally conductive layer.

30. A film bulk acoustic resonator (FBAR) structure, comprising:

an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector; and a plurality of vias, each of the plurality of vias being disposed substantially directly beneath the FBAR, and each of the plurality of vias being in thermal and electrical contact with the second electrode through a thermally and electrically conductive layer.

31. An FBAR structure as recited in claim 30, wherein the thermally and electrically conductive layer is disposed on at least one side of the acoustic reflector.

32. An FBAR structure as claimed in claim 30, wherein at least one rare earth element is incorporated into a crystal lattice of the piezoelectric layer.

33. An FBAR structure as claimed in claim 32, wherein the at least one rare earth element comprises scandium (Sc).

34. An FBAR structure as claimed in claim 32, wherein the at least one rare earth element comprise at least two rare earth elements incorporated into the crystal lattice of the piezoelectric layer.

35. An FBAR structure as claimed in claim 34, wherein the at least two rare earth elements comprises scandium (Sc) and erbium (Er).

36. An FBAR structure as claimed in claim 34, wherein the at least two rare earth elements further comprises yttrium (Y).

37. An FBAR structure as claimed in claim 30, further comprising a post disposed in the acoustic reflector, the post extending between and being thermally connected to the second electrode and at least one of the plurality of vias.

38. An FBAR structure as claimed in claim 37, wherein the post is electrically conducting and is in electrical contact with the second electrode and the at least one of the plurality of vias.

39. An electrical filter comprising the FBAR structure of claim 30.

40. A film bulk acoustic resonator (FBAR), comprising:
an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector;

a plurality of vias, each of the plurality of vias being disposed substantially directly beneath the FBAR, and each of the plurality of vias being in thermal contact with the second electrode; and a post disposed in the acoustic reflector, the post extending between and being thermally connected to the second electrode and at least one of the plurality of vias.

41. An FBAR structure as claimed in claim 40, wherein the post is electrically conducting and is in electrical contact with the second electrode and the at least one of the plurality of vias.

42. An FBAR structure as claimed in claim 40, further comprising a thermally conductive layer disposed on at least one side of the acoustic reflector, the thermally conductive layer being in thermal contact with the second electrode.

43. An FBAR structure as claimed in claim 42, wherein the thermally conductive layer is electrically conductive, and is in electrical contact with the second electrode.

44. An FBAR structure as claimed in claim 42, wherein each of the plurality of vias is in thermal contact with the second electrode through the thermally conductive layer.

45. An FBAR structure as claimed in claim 40, wherein at least one rare earth element is incorporated into a crystal lattice of the piezoelectric layer.

46. An FBAR structure as claimed in claim 45, wherein the at least one rare earth element comprises scandium (Sc).

47. An FBAR structure as claimed in claim 45, wherein the at least one rare earth element comprise at least two rare earth elements incorporated into a crystal lattice of the piezoelectric layer.

48. A film bulk acoustic resonator (FBAR), comprising:
an FBAR comprising: a first electrode; a piezoelectric layer disposed beneath the first electrode; a second electrode disposed beneath the piezoelectric layer; and an acoustic reflector disposed beneath the second electrode, wherein the second electrode spans first and second sides of the acoustic reflector;

a plurality of vias, each of the plurality of vias being disposed substantially directly beneath the FBAR, and each of the plurality of vias being in thermal contact with the second electrode; and a substrate in which the acoustic reflector is disposed, and through which each of the plurality of vias extends.

49. An electrical filter comprising the FBAR structure of claim 48.

50. An FBAR structure as claimed in claim 48, wherein at least one rare earth element is incorporated into a crystal lattice of the piezoelectric layer.

51. An FBAR structure as claimed in claim 50, wherein the at least one rare earth element comprises scandium (Sc).

52. An FBAR structure as claimed in claim 50, wherein the at least one rare earth element comprise at least two rare earth elements incorporated into the crystal lattice of the piezoelectric layer.

53. An FBAR structure as claimed in claim 52, wherein the at least two rare earth elements comprises scandium (Sc) and erbium (Er).

54. An FBAR structure as claimed in claim 52, wherein the at least two rare earth elements further comprises yttrium (Y).

55. An FBAR structure as claimed in claim 48, further comprising a post disposed in the acoustic reflector, the post extending between and being thermally connected to the second electrode and at least one of the plurality of vias.

56. An FBAR structure as claimed in claim 55, wherein the post is electrically conducting and is in electrical contact with the second electrode and the at least one of the plurality of vias.

57. An FBAR structure as claimed in claim 48, further comprising a thermally conductive layer disposed on at least one side of the acoustic reflector, the thermally conductive layer being in thermal contact with the second electrode.

58. An FBAR structure as claimed in claim 57, wherein the thermally conductive layer is electrically conductive, and is in electrical contact with the second electrode.

59. An FBAR structure as claimed in claim 57, wherein each of the plurality of vias is in thermal contact with the second electrode through the thermally conductive layer.

* * * * *